United States Patent [19]

Buck

[11] 4,203,066

[45] May 13, 1980

[54] ACCESS MODULE

[75] Inventor: Josef J. Buck, Minneapolis, Minn.

[73] Assignee: Magnetic Controls Company, Minneapolis, Minn.

[21] Appl. No.: 856,503

[22] Filed: Dec. 1, 1977

[51] Int. Cl.² ............................................. G01R 31/02
[52] U.S. Cl. ....................................... 324/51; 324/133
[58] Field of Search ................................... 324/51–54, 324/158 F, 133, 73 R, 73 AT

[56] References Cited

U.S. PATENT DOCUMENTS

| | | | |
|---|---|---|---|
| 3,217,244 | 11/1965 | Glover | 324/54 |
| 3,430,135 | 2/1969 | Mullen | 324/54 |
| 4,020,414 | 4/1977 | Paredes | 324/133 |

Primary Examiner—Michael J. Tokar
Attorney, Agent, or Firm—Dorsey, Windhorst, Hannaford, Whitney & Halladay

[57] ABSTRACT

A patching module having an improved switching and monitor feature for use in a patch unit assembly. The monitor feature includes a monitor plug with monitor elements capable of directly monitoring selected leads of the circuit within the module without drawing any power from such circuit. Each module is provided with appropriate connections for an independent power source.

13 Claims, 16 Drawing Figures

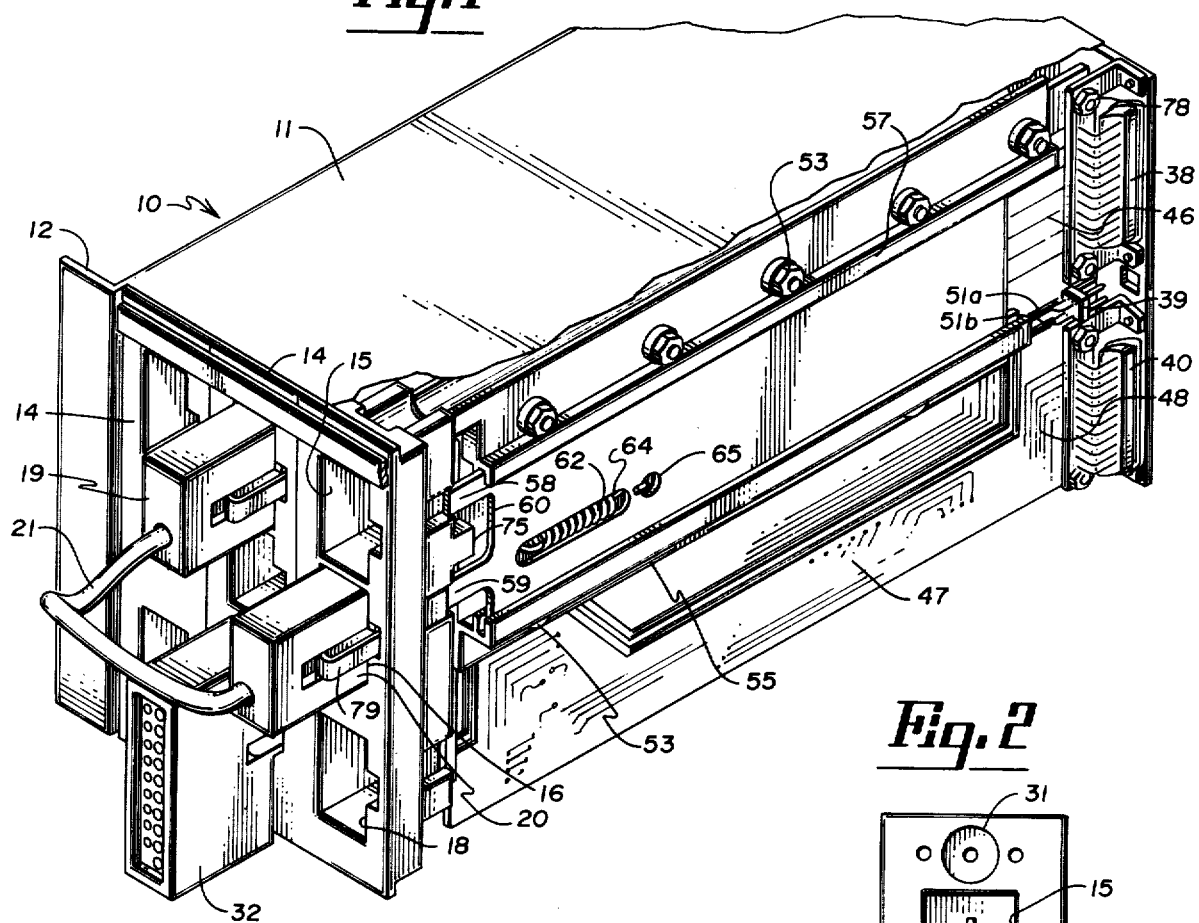
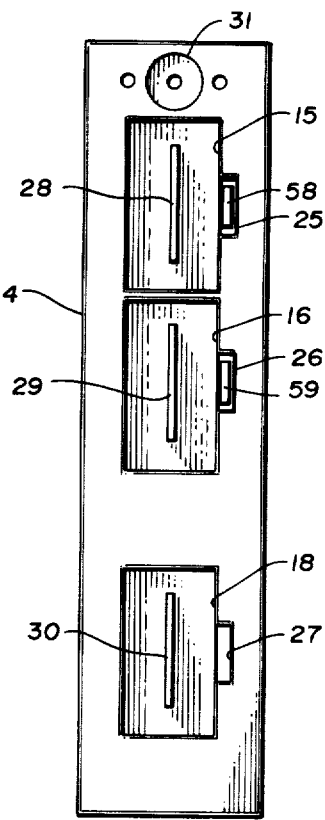
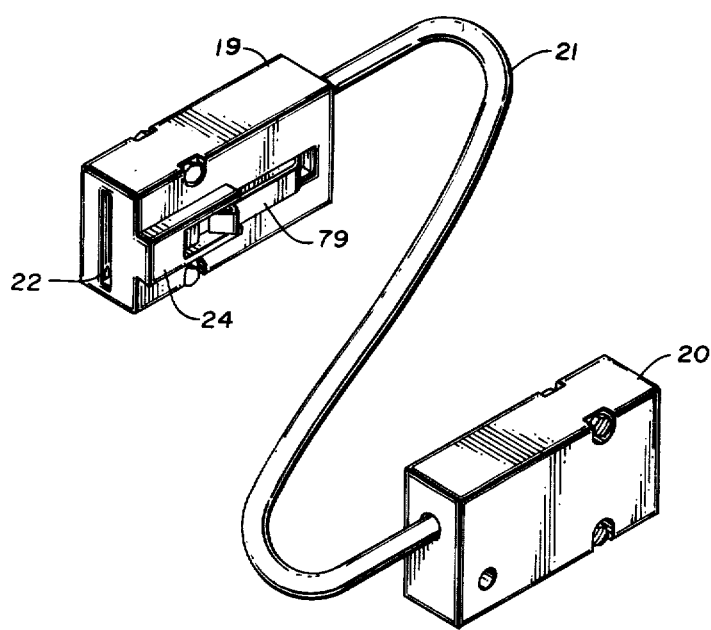

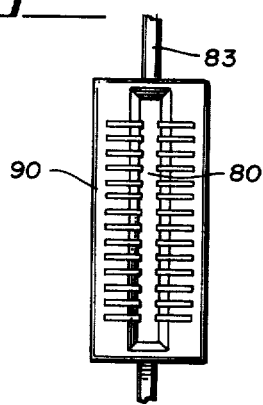
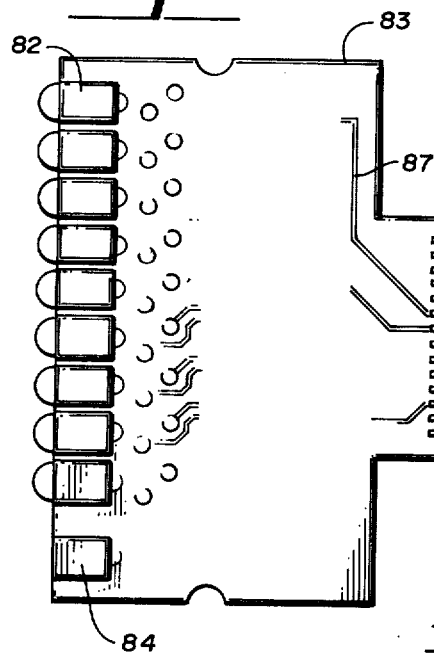
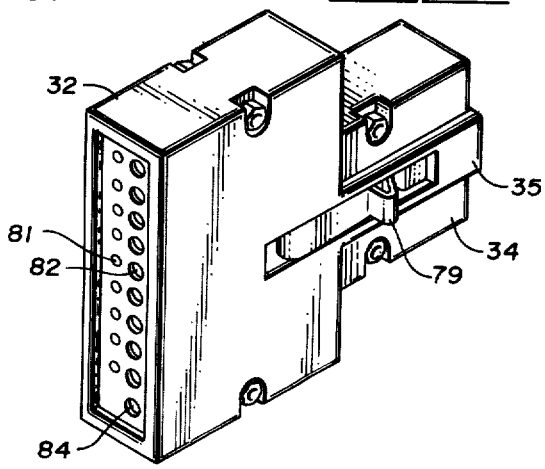
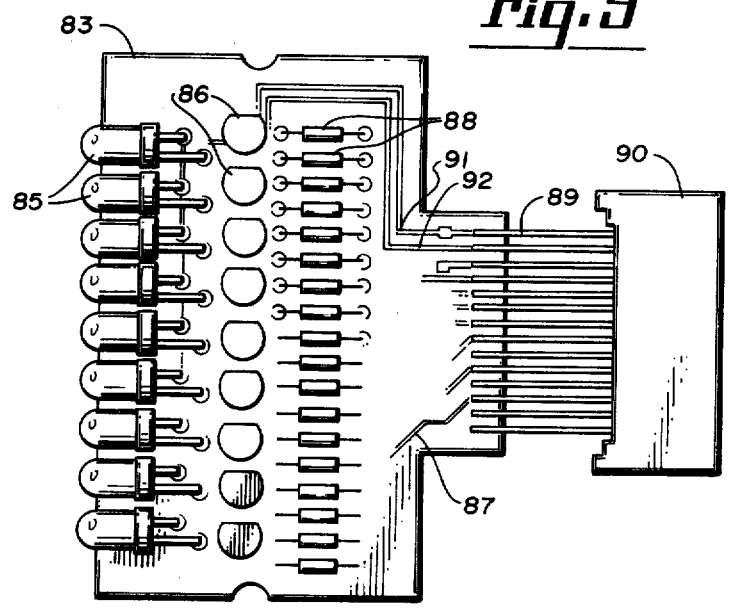
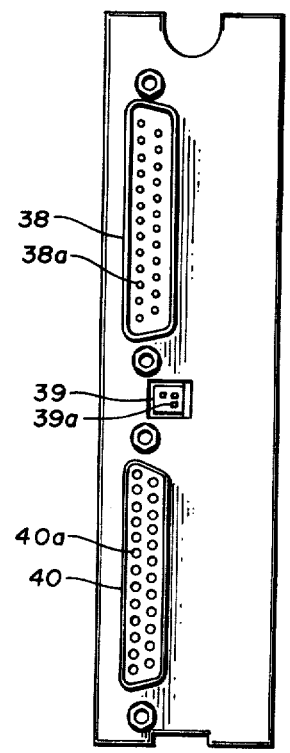

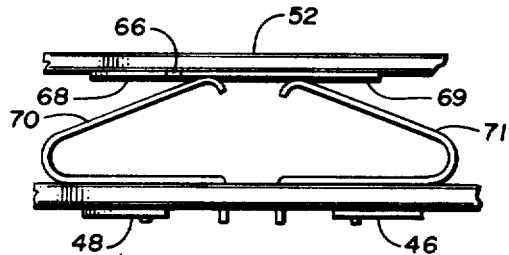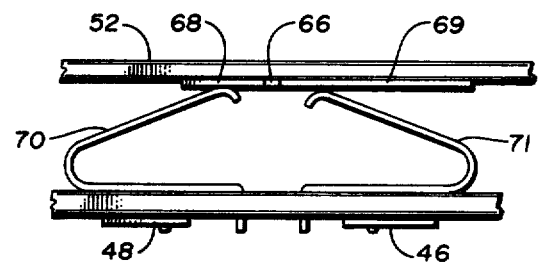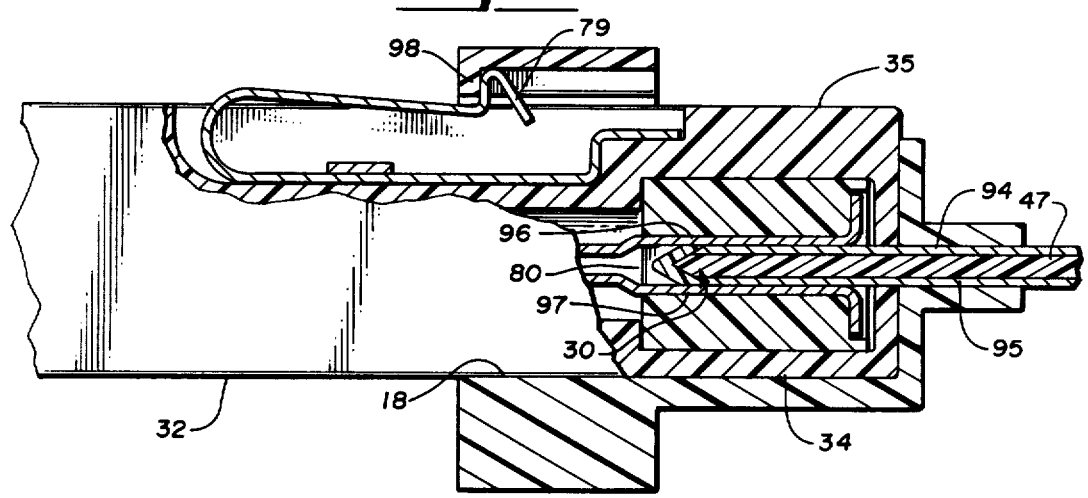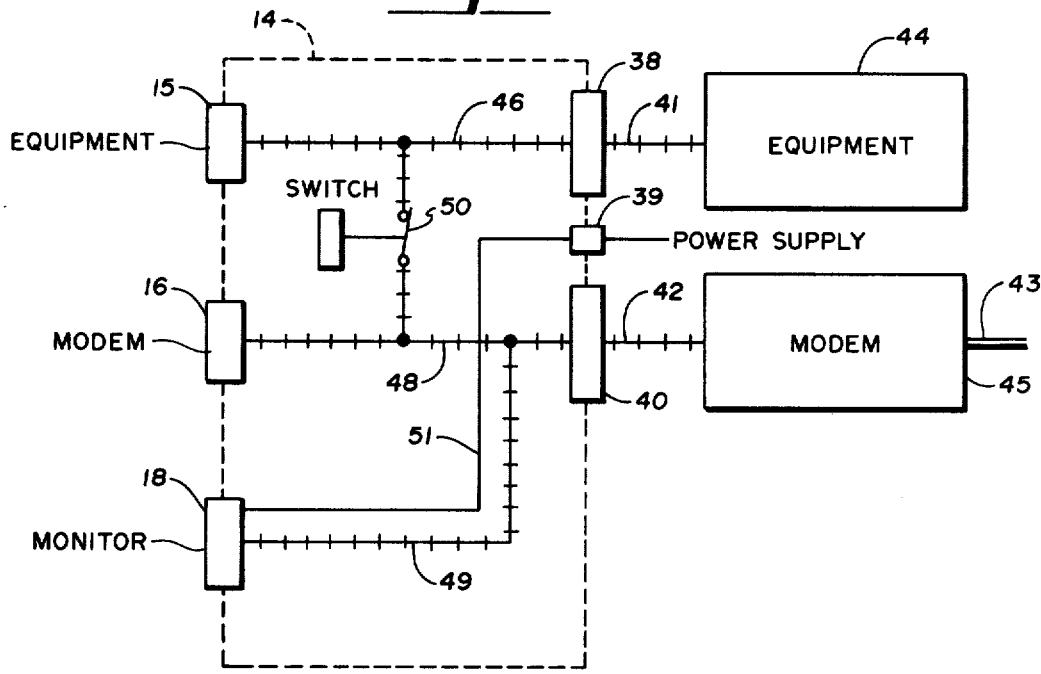

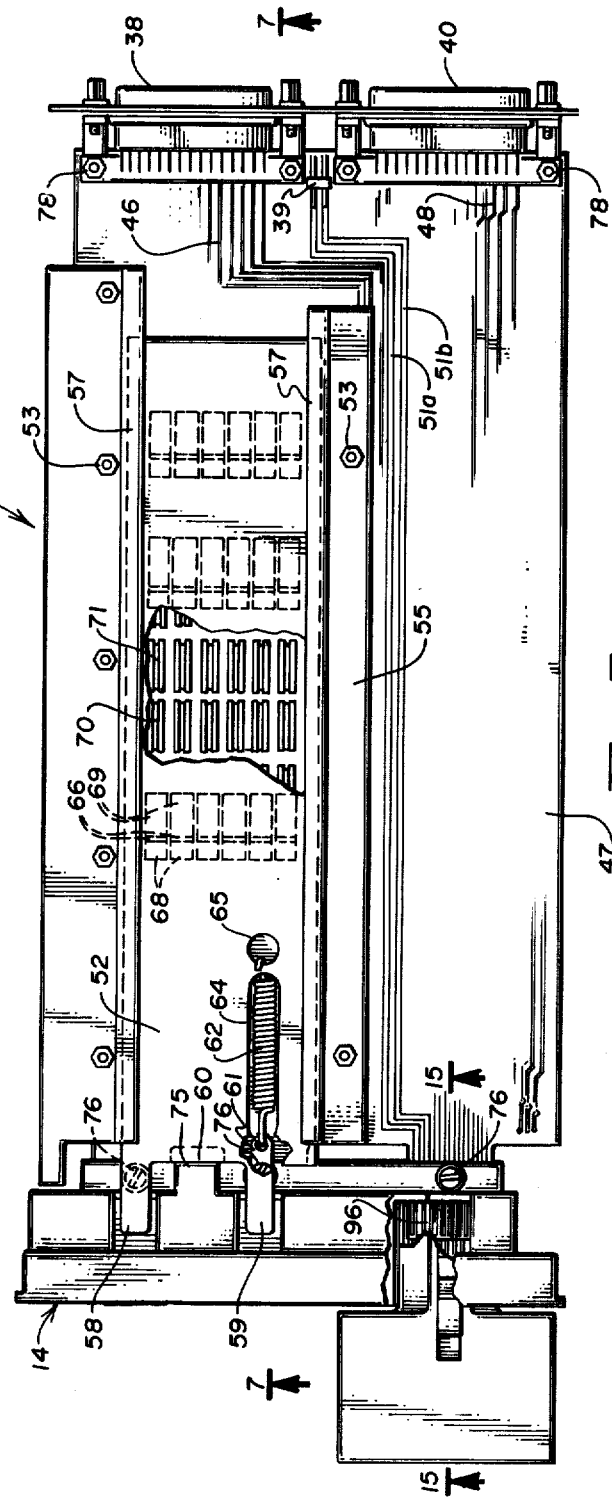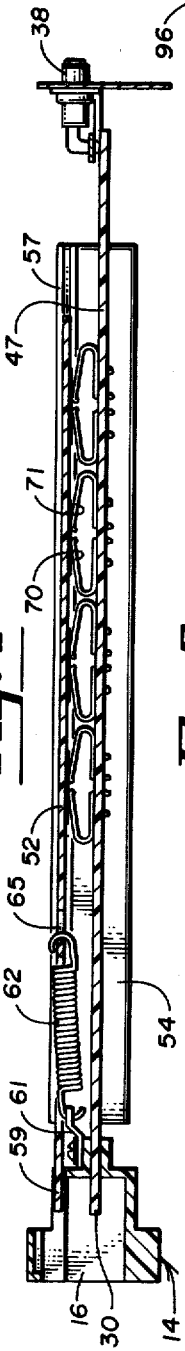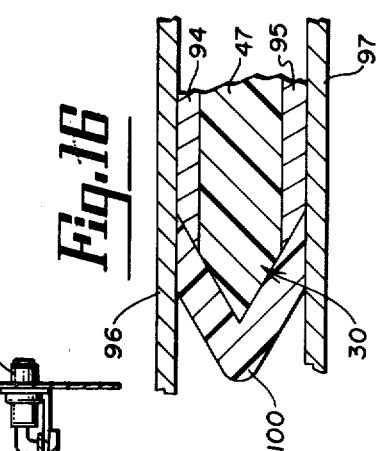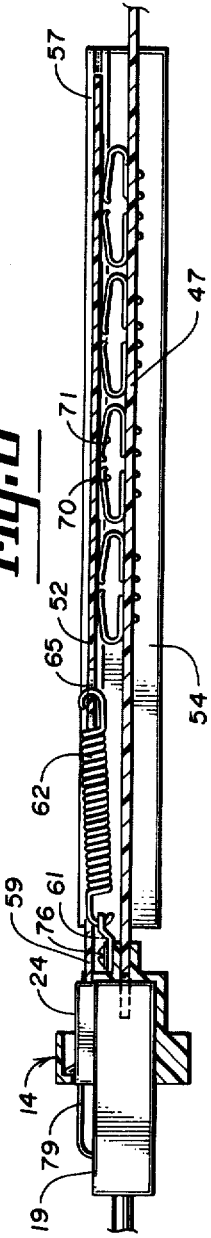

ACCESS MODULE

BACKGROUND OF THE INVENTION

The present invention relates generally to a channel access module for use in a patch unit assembly, and more particularly, to a channel module having an improved monitor plug for directly monitoring certain leads of a data transmission circuit and having an improved switching means between the respective leads of the equipment and modem.

Several types of patch unit assemblies, and in particular, digital patch unit assemblies presently exist in the prior art. Some of these assemblies consist of a unit frame or rack in which a plurality of patching modules are disposed in side-by-side relationship. Each of these patch modules is individually removable without affecting operation of the others and each includes an access to the leads on the equipment or computer side of a data transmission circuit and an access to the leads on the modem side of a data transmission circuit. These prior art patch modules also include a switching means positioned between the equipment and modem for either electrically connecting their respective leads or disconnecting them so that access can be gained to the individual leads. Most of these prior art devices include suitable patch cords designed for use wih the unit in order to patch the leads from a designated piece of equipment to a desired modem, or vice versa. This is accomplished by inserting one plug of the patch cord into the desired equipment access opening and the other plug of the patch cord in the desired modem access opening. Insertion of such plugs into the respective access openings opens the normal data transmission circuit within the module and permits cross patching of the various equipment and modem leads.

Means are also provided in these prior art patch modules for monitoring the data transmission circuit between the equipment and modem. Access for monitoring is normally provided by an appropriate access opening in the front of the module panel. A monitor access plug similar to the patch plugs referred to is utilized to gain access to the data transmission leads and for electrically connecting such leads via a monitor plug cord to a separate monitor power module physically separated from the module being monitored. Normally, this monitoring power module is positioned on one end of an array of access modules and includes a plurality of LED indicator lamps and pin-jack access points for the breakout or testing of certain of the data transmission leads. A typical patch unit assembly of the type described above is disclosed in U.S. Pat. No. 4,037,186.

The principal drawback of the above described prior art devices is that they are not capable of monitoring more than one of the patch modules at any one time. A typical path unit assembly of the prior art contains only a single power and monitoring unit positioned to provide a monitoring function for an array (usually about 10 to 20) of individual modular units. Accordingly, only one of the modular units can be monitored at any one time. A further drawback is that the monitor power unit positioned within the patch unit assembly takes up and reduces the space which might otherwise be utilized by functioning modular access modules.

Therefore, a need exists in the art for a patch module with a monitor feature capable of monitoring more than one module simultaneously while at the same time providing increased space for such modules.

SUMMARY OF THE INVENTION

The device of the present invention overcomes the drawbacks of the above described prior art and other prior art of which the inventor is aware by providing an access or channel module with an improved monitoring plug which permits direct monitoring of the data transmission circuit within the module without the need for a separate power unit or monitor module as was necessary in the prior art. This eliminates the need for an additional monitor power unit module in the patch unit assembly and a monitor patch cord and plug to connect the leads to be monitored with such power unit. The device of the present invention also permits the simultaneous monitoring of any number of the individual channel modules. The device of the present invention also includes an improved mechanical switching mechanism which involves a wiping action of a spring member on a connector surface pad.

More specifically, the channel module of the present invention includes an improved monitor plug which contains a plurality of LED indicator lamps and pinjack access points within the plug itself for direct monitoring of certain designated leads of the data transmission circuit. Such improved monitor plug functions without drawing any power from the data transmission circuit itself. Rather, each of the modules is provided with its own independent external power source connected through the module via appropriate printed circuit leads to the monitor plug for driving the LED indicator lamps. Since each of the individual channel modules is provided with its own external power source, any number of such modules can be monitored simultaneously and continuously. This independent power source for each module eliminates the need for a separate monitor power unit; therefore, the space which would normally be used by such monitor power unit can be utilized by additional channel modules, thus providing for a more efficient system. The advantages of the present invention can also be realized with only the pin-jack portion of the monitor plug. With this structure, the external power source is unnecessary.

The channel module also includes an improved switching mechanism which includes a pair of gold plated spring elements associated with each of the pair of equipment and modem leads for selectively connecting and disconnecting such leads. These contact members cooperate with a similar number of gold plated wiping pads for selectively connecting and disconnecting the pair of contact members in response to sliding movement of a spring-biased switching board. The wiping pads are pressed into the surface of the switching board so that their contact surface is flush with the inner surface of the switching board. The module of the present invention also includes an improved mating element for electrically connecting the data transmission circuit in the module with either the access or the monitor plugs. This element includes a tip portion composed of an abrasion resistant material which substantially reduces the wiping contact between the epoxy-glass circuit board and the plug contacts and therefore reduces the wear on such contacts.

Accordingly, a principal object of the present invention is to provide a channel module with an improved monitor feature which eliminates the need for an additional, separate monitor power unit in the patch unit assembly and permits the simultaneous monitoring of any number of modular units.

Another object of the present invention is to provide a channel module having an improved monitor plug which, together with the module, provides for direct monitoring of selected leads of the data transmission circuit.

A further object of the present invention is to provide a channel module with an improved monitor plug which enables direct monitoring of the data transmission circuit via LED indicator lamps and pin-jack access points.

Another object of the present invention is to provide a channel module having its own power source for driving the LED indicator lamps of the improved monitor plug.

A further object of the present invention is to provide an improved mechanical switching mechanism for selectively connecting or disconnecting the leads of the equipment and modem.

A further object of the present invention is to provide a channel module having improved mating means for reducing wiping contact between such means and the plug contacts and thereby substantially reducing wear on such contacts.

These and other objects of the present invention will become apparent with reference to the drawings, the description of the preferred embodiment and the appended claims.

DESCRIPTION OF THE DRAWINGS

FIG. 1 is a pictorial view of a portion of a patch unit assembly showing three channel modules inserted therein.

FIG. 2 is a front elevational view of one of the channel modules of the present invention.

FIG. 3 is a rear elevational view of one of the channel modules of the present invention.

FIG. 4 is a pictorial view of a patch cord utilized with the patch unit assembly of the present invention.

FIG. 5 is a schematic diagram illustrating the electrical interconnection between the various system components shown in the other figures.

FIG. 6 is a side elevational view of one of the channel modules of the present invention with certain portions broken away.

FIG. 7 is a cross sectional view of the channel module viewed along the section lines 7—7 of FIG. 6 showing the switching mechanism in a closed position.

FIG. 8 is a cross sectional view of the channel module similar to that of FIG. 7 except with the switching mechanism open.

FIG. 9 is an elevational view of the LED side of the ciruit board assembly of the improved monitor plug of the present invention.

FIG. 10 is an elevational end view of the circuit board assembly of the improved monitor plug of the present invention.

FIG. 11 is an elevational view of the pin-jack side of the printed circuit board assembly of the improved monitor plug of the present invention.

FIG. 12 is a pictorial view of the improved monitor plug of the present invention.

FIGS. 13 and 14 are detailed views of one element of the switching mechanism showing the element in a closed and open position, repectively.

FIG. 15 is a cross sectional view as viewed along the section lines 15—15 of FIG. 6.

FIG. 16 is a detailed cross sectional view showing the improved mating element and the electrical connection between the module and the monitor plug.

DESCRIPTION OF THE PREFERRED EMBODIMENT

Reference is first made to FIG. 1 which shows a patch unit assembly used primarily for accessing, rearranging or substituting interconnections between various data equipment in a network, such as computers, and modems, multiplexers, etc. As illustrated, the patch unit assembly includes a rack or frame designated generally by the reference numeral 10 and consists of a top panel 11 and appropriate bottom, side and rear panels (not shown). Each end of the front surface of the patch unit 10 includes a mounting flange 12 (only one of which is illustrated in FIG. 1) for mounting the patch unit 10 to an appropriate housing or rack. The assembly unit 10 is adapted to house a plurality of channel access modules 14 disposed in side-by-side relationship with respect to each other. In FIG. 1, three such channel modules 14 are shown in operating position within the patch unit 10. In a typical patch unit assembly of the type described herein, fourteen channel modules are contained within each unit. It is common for patch units of the type illustrated in FIG. 1 to be vertically stacked one on top of the other.

In general, the function of the patch unit 10 and more particularly, the channel modules 14, is to provide electrical interconnection between certain local equipment such as a computer and a modem, to provide access to the various leads of the equipment and modem and to provide monitoring of the data transmissions circuits between such equipment and modem.

The function of each channel module and the array of channel modules within the patch unit can be understood best with reference to the schematic illustration of FIG. 5 in which the channel module is illustrated schematically by the broken line 14. As shown, a piece of local equipment 44 which in some cases may be a computer is connected over a multi-wire line 41 to a connector 38 at the rear of the channel module 14. The multi-wire line 41 may consist of any number of individual wires, but generally consists of at least 24 or more wires or leads. Similarly, a modem 45 is connected by a multi-wire line 42 to a rear connector 40. As with the line 41, the line 42 may consist of any number of wires or leads, but usually consists of at least 24 or more such wires. The modem 45 is also connected to a common carrier communications line 43 by which information or signals can be transmitted to and from the modem 45. An external power supply 39 is provided at the rear of the channel module for providing power to an improved monitor plug as will be discussed below.

Within the channel module 14, the leads from the rear connector 38 are connected via the multi-wire line 46 both to an equipment access opening 15 and to one side of a switch mechanism 50, while the leads from the connector element 40 are connected via the multi-wire line 48 to both a modem access opening 16 and to the other side of the switch 50. Both of the multi-wire lines 46 and 48 represent a plurality of printed leads printed onto a circuit board as will be discussed below. The switch 50 comprises a plurality of separate mechanical switches, the exact number of which correspond to the number of wires or leads in the multi-wire lines 46 and 48. The switch 50 is normally biased in its closed position as illustrated in FIG. 5, thereby electrically connecting the corresponding leads of the multi-wire lines 46 and 48 and thus the equipment 44 and modem 45. When the switch 50 is in its closed position, audio frequency tone signals from the common carrier communications line 43 can be converted by the modem 45 to a signal acceptable to the local equipment 44 and sent to such equipment via the channel module 14. Similarly, signals from the local equipment 44, such as a computer, may, via the channel module 14, send signals back through the modem 45 to the communications line 43 for transmission to a desired point.

When the switch 50 is open, the multi-wire lines 46 and 48 are disconnected from each other, thus permitting access to their leads at the access openings 15 and 16, respectively. As will be discussed below, the switch 50 is opened by insertion of an appropriate access plug into either of the access openings 15 or 16. When an appropriate plug is inserted into the access opening 15, switch 50 is opened and access is provided to each of the leads of the multi-wire line from the equipment 44. This permits the connection of these leads to any other desired modem via an appropriate patch cord. Likewise, insertion of an access plug into the access opening 16 opens the switch 50 permitting access to the leads of the modem 45 and connection to any desired computer or other local equipment.

The channel module 14 of FIG. 5 also shows a multi-wire line 49 extending between the line 48 and the monitor access opening 18. This connection facilitates the monitoring of the data circuit between the equipment 44 and the modem 45, if the switch 50 is in its closed position, or the monitoring of the data circuit between the modem 45 and the other equipment to which it is connected, if the switch 50 is open. The power source 39 positioned between the connectors 38 and 40 is connected with the monitor access opening 18 via the power source supply line 51 to provide external power to the improved monitor plug in the manner discussed below.

The specific structure of the channel module 14 is illustrated best in FIGS. 2, 3, 6, 7 and 8. As shown in FIG. 2, the forward end of the channel module 14 includes three access openings 15, 16 and 18 for providing electrical access to certain circuits and leads within the module 14. The access opening 15 is associated with the equipment 44 (FIG. 5) and provides access to each of the leads of such equipment via the male access element 28. The element 28 includes a plurality of contact portions corresponding to the plurality of equipment leads. The access opening 16 is associated with the modem 45 (FIG. 5) and provides access to each of the leads of such modem via the male access element 29. The element 29, similar to the element 28, includes a plurality of contact portions corresponding to the plurality of modem leads. Each of the elements 28 and 29 includes a tip composed of an abrasive resistant tip such as Nylon similar to that illustrated in FIGS. 15 and 16 with respect to the element 30.

Access to the leads within the access openings 15 and 16 is obtained by a patch cord plug 19 or 20. As illustrated in FIGS. 1 and 4, a typical patch cord includes a pair of patch cord plugs 19 and 20 and a connecting cord 21 extending therebetween. The plugs 19 and 20 are adapted for insertion into the access openings 15 and 16 for access to the leads of the equipment and modem, respectively. Each of the plugs 19 and 20 includes a female receptacle portion 22 adapted to mate with the corresponding male access elements 28 and 29 in the openings 15 and 16. The plugs 19 and 20 also include a guide rib or key 24 adapted to mate with the notch 25 or 26 of the access openings to insure proper alignment of the plugs and proper interconnection of the associated leads. A spring latch 79 is associated with each of the plugs 19 and 20 to provide a positive locking mechanism for retaining the plugs 19 and 20 within the desired openings 15 and 16 and preventing accidental or unintentional disconnection. The latch 79 is designed to lock behind a portion of the module 14 similar to the manner in which the monitor plug is locked in the opening 18 as illustrated in FIG. 15. As shown in FIG. 1, the patch cord can be utilized to electrically interconnect the leads in any one of the equipment access openings 15 with the leads in a desired modem access opening 16 or vice versa.

With reference to FIG. 3, the rear of the module 14 includes a connector member 38 having a plurality of male connector pins 38a for connecting leads from the equipment or computer 44 (FIG. 5) to the module 14. A similar connector member 40 having a plurality of female connector receptacles 40a is also positioned at the rear of the module 14 for connecting leads of the modem 45 (FIG. 5) thereto. Between the connectors 38 and 40 is a power supply connector 39 for providing external power to the improved monitor plug in the manner described below. The connector 39 includes the male connector pins 39a for connecting the power source (not shown) to the module.

Referring now to FIGS. 6, 7 and 8, the forward portion of the module consits of a single piece of molded plastic defining the various access openings. A printed circuit board 47 is connected with this forward portion by a plurality of screws 76. The printed circuit board 47 is a thin, generally rectangular element whose rearward end is connected by appropriate screws 78 to the connecting elements 38 and 40. A plurality of pairs of contact elements corresponding to the leads from the connector members 38 and 40 are mounted in the circuit board 47. Each of these pairs includes a contact element 70 electrically connected with a lead from the connector 40 and a contact element 71 electrically connected with a corresponding lead from the connector 38. The connection between the contact 70 and 71 and the connector 38 and 40 is provided by the circuit elements 46 and 48, respectively. The elements 46 and 48 are printed circuit elements which not only connect the leads from connectors 38 and 40 to contacts 70 and 71, but which also connect such leads to the access openings 15 and 16, respectively (FIGS. 1 and 2).

A switching board 52 is positioned in sliding relationship relative to the plurality of contact elements 70 and 71 and relative to the printed circuit board 47 by a pair of spaced guide members 54 and 55. Each of the guide members 54 and 55 is secured to the board 47 by screws or rivets 53 and each includes a channel portion 57 to engage and guide the opposite edges of the switching board 52 during its sliding movement. The switching board 52 includes a plurality of switching elements correspoi.ding to the plurality of contact element pairs 70 and 71 for selectively electrically connecting or disconnecting the associated elements 70 and 71. The switching board 52 is moveable between a normal or closed position illustrated in FIGS. 6 and 7 in which switching elements are closed and an open position as illustrated in FIG. 8 in which the switching elements are opened. When in a closed position, the switching elements electrically connect the contacts 70 and 71, whereas in an open position, the contacts 70 and 71 are disconnected from each other. The switching board 52 is normally biased in a closed position by the spring element 62 which extends in the elongated opening 64 between the hole 65 and the connecting element 61.

The particular switching elements of the present invention can best be illustrated by reference to FIGS. 13 and 14. As shown, each pair of contact elements 70 and 71 is connected with the printed circuit board 47 by appropriate means. These contact elements 70 and 71 are, in turn, electrically connected with leads from the modem and the equipment via the printed circuit elements 48 and 46, respectively. A pair of these contact elements 70 and 71 correspond with each of the leads from the equipment and the modem. In the structure of the preferred embodiment, the channel module 14 can accommodate as many as 24 leads from both the equipment and the modem; accordingly, there are 24 pairs of contact elements 70 and 71. Each of the elements 70 and 71 is constructed of a spring tempered copper alloy or other suitable conducting material and has a portion extending outwardly from the circuit board 47 for engagement with the underside of the switching board 52. In the preferred structure, the contacts 70 and 71 include a gold plate spring portion extending upwardly from the circuit board 47 for biased engagment with portions of the board 52.

The underside of the switching board 52 includes a pair of surface contacts 68 and 69 associated with each pair of contact elements 70 and 71. The contact surfaces 68 and 69 are electrically insulated from each other by the portion 66. In FIG. 13, the switching board 52 is in its normal or closed position similar to the position illustrated in FIGS. 6 and 7. In this position, both of the contact elements 70 and 71 are in contact with the surface 69, thereby electrically connecting the elements 70 and 71 and the respective leads of the equipment and modem. When the switching board 52 is moved toward the right as shown in FIGS. 8 and 14, against the force of the spring 62 (FIG. 6), the members 70 and 71 contact the surfaces 68 and 69, respectively which are electrically insulated from each other thereby disconnecting the respective leads of the equipment and modem. In the preferred embodiment, the surfaces 68 and 69 comprise gold plated contact pads which are pressed into the surface of the switching board 52 under conditions of high temperature and pressure. This results in a structure in which the contact surface portions of the pads 68 and 69 are flush with the inner surface of the switching board 52. The insulating portion 66 between the pads 68 and 69 is a part of and integral with the board 52.

The switching board 52, which is normally in a closed position, is moved to its open position by insertion of one of the patch cord plugs 19 or 20 (FIGS. 1 and 4) into either of the access openings 15 or 16 (FIGS. 1 and 2). When this is done, the forward portion of the guide rib 24 on the plug engages a tab portion 58 or 59 of the switching board 52 and moves the same rearwardly against the force of the spring 62. The plug 19 or 20 and the board 52 are locked in this position by the latch spring 79 until the same is manually released.

The circuit between the modem 45 and equipment 44 or between the modem 45 and any other equipment to which it is patched can be monitored at the monitor access opening 18 (FIGS. 1, 2 and 15) by insertion of the improved monitor plug illustrated in FIGS. 9-12. Before describing the specific structure of such plug, it should be noted that the leads from the modem 45 are electrically connected with the plurality of contact elements 94 and 95 (FIGS. 6 and 15) on the male element 30, thus providing monitoring access to the data transmission circuit on the modem side of the switch mechanism.

The specific structure of one form of the improved monitoring module is shown best in FIGS. 9-12. FIG. 12 is a pictorial view of the monitor plug while FIGS. 9-11 are views of the inside portion of such plug. As shown in FIG. 12, the monitor plug 32 includes a plug portion 34 and a guide rib 35 for insertion into the access opening 18 and slot 27 (FIG. 2), respectively. A latch spring 79 is disposed within a portion of the guide rib 35 and is designed to engage a portion of the channel module to secure the monitor plug in its fully inserted position and to prevent accidental disconnection. A plurality of LED indicator points 81 and pin-jack access points 82 are also provided for direct monitoring of certain of the leads to which access is provided. As shown best in FIGS. 10 and 15, the end of the plug portion 34 includes a female receptacle portion 80 with a plurality of contacts 96 and 97 adapted for electrical engagement with the corresponding contact elements 94 and 95 of the male element 30.

With reference to FIGS. 9 and 11, the internal portion of the monitor plug 32 includes a thin, generally "T" shaped printed circuit board 83, an end portion 90 and a plurality of connector elements 89 extending between the circuit board 83 and the end 90. Each of the connectors 89 is electrically insulated from the other and each corresponds to one of the contacts 96 or 97 (FIG. 15) within the end 90. FIG. 9 which shows the LED (light emitting diode) side of the printed circuit board 83 includes a plurality of LED indicator lamps 85. These elements 85, together with a corresponding number of current sensing elements and resistor pairs, 86 and 88 (FIG. 11), respectively are electrically interconnected to monitor the presence or absence of a current or signal in certain of the leads 94 or 95 to which monitoring access is provided without drawing any power or interfering with any signals in the data transmission circuit. Power for the LED indicators 85 is provided by the power supply 39 (FIG. 6) via the power supply leads 51a and 51b. These leads are connected to two of the contacts 94 and 95 and ultimately to the LED indicator lamps 85 by the printed leads 91 and 92 shown in FIG. 11 on the pin-jack side of the circuit board 83. A variety of different types of LED lamps 85, sensing elements 86 and resistors 88 can be used in the monitor module. In the preferred embodiment, however, the indicator lamps 85 Gallium Phosphide LEDs and the detection elements 86 consist of current sensing transistors. The resistor pairs 88 consist of one ¼ watt carbon composition, 27,000 ohm resistor and one ¼ watt carbon composition, 68 ohm resistor.

With reference now to FIG. 11, the pin-jack side of the circuit board 83 is shown as including a plurality of pin-jack access receptacles 82 electrically connected with certain of the contact elements 89, and thus with certain of the leads 49 (FIGS. 5 and 9) of the data transmission circuit. A pin-jack receptacle 84 is also provided on one end for access to the external power source if desired.

As illustrated best in FIGS. 9 and 11, a selected number of the twenty-four leads 49 in the data transmission circuit capable of being monitored are electrically connected to the LED and the pin-jack circuitry to permit those selected leads to be continuously monitored. These selected leads are those which are considered most important in the data transmission circuit and are designated in FIGS. 9 and 11 by the reference numberal 87. In the preferred embodiment, nine such leads can be continuously monitored with the plug 32.

FIG. 16 illustrates a detailed cross sectional view of the electrical connection between the contacts on the portion 30 and the contacts in the end 90 of the monitor plug 32. The portion 30 is comprised of an extended portion of the circuit board 47, having a plurality of electrical contacts 94 and 95 disposed on each side thereof. Each of the contacts 94 and 95 is electrically connected with one of the twenty-four leads of the data transmission circuit or the power source leads 51a and 51b (FIG. 6). The plug end 90 (FIGS 9-11) includes a plurality of internal contact elements 96 and 97 adapted for electrical connection with the elements 94 and 95 to connect the leads in the patch module to the monitor module. Similar contact elements and connections exist between the male access portions 28 and 29 (FIG. 2) and the patch plugs 19 and 20 (FIGS. 1 and 4).

As shown in FIG. 16, the forward end of the portion 30 is beveled. This beveled portion extends rearwardly through the contact elements 94 and 95. A coating of an abrasion resistant material 100 is secured to this beveled portion to substantially eliminate wiping contact between portions of the epoxy glass circuit board 47 and the contacts 96 and 97. In the preferred embodiment, the portion 100 is constructed of a Nylon material although various other abrasion resistant materials will also work satisfactorily. With this construction, the life of the monitor plug contacts 96 and 97 is increased substantially.

It should be noted that only one form of monitor module is shown in the present drawings. Such module is illustrated in FIGS. 9-12 and includes both LED indicator lamps and pin-jack access points. Similar modules can also be constructed which include only the LED circuitry as the monitoring means or only the pin-jack access as the monitoring means. It should also be noted that if monitoring of leads other than the selected leads 87 is desired, this can be done, as in the prior art, by using a patch or monitor cord to connect all twenty-four of the leads 94 and 95 (FIG. 15) to an appropriate test station (not shown).

Having described the structure of the improved channel module and monitor plug of the present invention, the operation of the same can be understood as follows. First, the channel module 14 is inserted into the rack or housing of a patch unit assembly 10 as illustrated in FIG. 1. When so inserted, the access openings 15, 16 and 18 are disposed on the front face of the assembly to monitor the data transmission circuits within the module and to access the leads of the equipment and modem. As shown in FIG. 5, the equipment 44 such as a computer and the modem 45 are electrically connected with each other through the channel module 14 via the connector elements 38 and 40 and the switch mechanism 50. If access to either the plurality of leads from the equipment 44 or the plurality of leads from the modem 45 is desired for analysis or cross patching, a patch cord plug similar to that illustrated in FIG. 4 is inserted into either the access opening 15 or the access opening 16. If the plug is inserted into opening 15, the switch mechanism 50 is opened thereby breaking the normal through connection between the equipment 44 and the modem 45 and providing access to all 24 leads from the equipment.

Similarly, if the patch cord plug is inserted into the access opening 16, the switch mechanism 50 is opened, again breaking the normal through connection between the equipment and the modem, and providing access to all 24 leads of the modem. With this structure, the leads of the modem 45 can be connected with the equipment 44 by leaving the switch mechanism 50 in its closed position or can be electrically connected with any other equipment accessible in the array of modules by utilization of a patch cord. In a similar manner, the leads of the equipment 44 can be electrically connected to the modem 45 when the switch mechanism is closed or via a suitable patch cord be connected with any other modem in the patch unit assembly.

An improved monitoring means is also provided which monitors selected leads on the modem side of the switch mechanism 50. These leads, together with an external power source and the unselected leads are connected to the access opening 18 via the multiwire line 49 and the pair of leads 51 shown in FIG. 5. With this structure the improved monitor plug illustrated in FIGS. 9-12 and 15 can be utilized to directly monitor selected leads on the modem side of the switch simutaneously with any other transmission circuit in the patch unit assembly and independently of any power unit or monitor module positioned in the patch unit assembly. This is possible because each of the channel modules 14 is provided with its own external power source which is connected at the rear of the module to the connector 39 and which is provided to the improved monitor plug via the leads 51a and 51b (FIG. 6). It should be noted that since the monitor access to the 24 leads is on the modem side of the switch 50, monitoring of a data transmission circuit set up by cross patching is always monitored at the module containing the connection to the modem.

Although the description of the preferred embodiment has been quite specific, it is contemplated that various changes could be made to the structure without deviating from the spirit of the present invention. Accordingly, it is intended that the scope of the present invention be dictated by the appended claims rather than by the description of the preferred embodiment.

I claim:

1. A digital patch and access module for use in a patch and access assembly having a series of said modules in side-by-side relationship comprising:

a first plurality of separate conductor leads;

a second plurality of separate conductor leads;

electrical switch means connected between said first plurality of separate conductor leads and said second plurality of separate conductor leads for selectively simultaneously connecting said first and second plurality of separate conductor leads and simultaneously disconnection said first and second plurality of separate conductor leads;

access means for providing monitoring access to a selected plurality of said separate conductor leads when said first and second plurality of conductor leads are electrically connected;

a connection for a power source independent of said plurality of conductor leads;

a selectively removable monitor plug adapted for connection with said access means, said monitor plug including monitor means adapted for monitoring connection with said selected plurality of said separate conductor leads and means adapted for electrically connected said power source conection and said monitor means.

2. The patch and access module of claim 1 wherein said monitor means includes pin-jack access to said selected plurality of said separate conductor leads.

3. The patch and access module of claim 2 wherein said access means includes means providing access to said power source.

4. The patch and access module of claim 3 wherein said monitor means includes a light emitting diode (LED) for monitoring said selected plurality of said separate conductor leads.

5. The patch and access module of claim 4 where said monitor means includes pin-jack access to said selected plurality of said separate conductor leads.

6. A patch and access assembly having a plurality of the connecting apparatus of claim 1 positioned in side-by-side relationship with each other.

7. A digital patch and access assembly comprising:
a frame;
a series of independently operable digital patch and access modules positioned side-by-side with respect to each other within said frame, each of said modules including;
a first plurality of separate conductor leads;
a second plurality of separate conductor leads;
electrical switch means connected between said first plurality of separate conductor leads and said second plurality of separate conductor leads for selectively simultaneously connecting said first and second plurality of separate conductor leads and simultaneously disconnecting said first and second plurality of separate conductor leads;
access means for providing monitoring access to a selected plurality of said separate conductor leads when said first and second plurality of conductor leads are electrically connected;
a connection for a power source independent of said plurality of conductor leads;
a selectively removable monitor plug adapted for connection with said access means, said monitor plug including monitor means adapted for monitoring connection with said selected plurality of said separate conductor leads and means adapted for electrically connecting said power source connection and said monitor means.

8. The patch and access assembly of claim 7 wherein said monitor means includes pin-jack access to said selected plurality of said separate conductor leads.

9. The patch and access assembly of claim 8 wherein said access means includes means providing access to said power source.

10. The patch and access assembly of claim 9 wherein said monitor means includes a light emitting diode (LED) for monitoring said selected plurality of said separate conductor leads.

11. The patch and access assembly of claim 10 where said monitor means includes pin-jack access to said selected plurality of said separate conductor leads.

12. The patch and access module of claim 1 having an equal number of first and second separate conductor leads.

13. The patch and access module of claim 1 wherein said monitor plug is adapted for connection only with said access means.

* * * * *